US011840097B2

(12) United States Patent
Arutinov (10) Patent No.: US 11,840,097 B2
(45) Date of Patent: Dec. 12, 2023

(54) HIGH RESOLUTION LASER INDUCED FORWARD TRANSFER

(71) Applicant: Nederlandse Organisatie voor toegepast-natuurwetenschappelijk onderzoek TNO, The Hague (NL)

(72) Inventor: Gari Arutinov, Helmond (NL)

(73) Assignee: Nederlandse Organisatie voor toegepast-natuurwetenschappelijk onderzoek TNO, 's-Gravenhage (NL)

( * ) Notice: Subject to any disclaimer, the term of this patent is extended or adjusted under 35 U.S.C. 154(b) by 399 days.

(21) Appl. No.: 17/294,204

(22) PCT Filed: Dec. 3, 2019

(86) PCT No.: PCT/NL2019/050800
§ 371 (c)(1),
(2) Date: May 14, 2021

(87) PCT Pub. No.: WO2020/117053
PCT Pub. Date: Jun. 11, 2020

(65) Prior Publication Data

US 2022/0009247 A1    Jan. 13, 2022

(30) Foreign Application Priority Data

Dec. 4, 2018   (EP) .................. 18210214.5

(51) Int. Cl.
*B41J 2/44*      (2006.01)
*H05K 3/12*      (2006.01)
*B41J 2/005*     (2006.01)

(52) U.S. Cl.
CPC .............. *B41J 2/442* (2013.01); *B41J 2/005* (2013.01); *H05K 3/12* (2013.01); *H05K 3/1241* (2013.01);
(Continued)

(58) Field of Classification Search
CPC ........ B41J 2/442; B41J 2/005; B41J 2202/04; H05K 3/12; H05K 3/1241; H05K 2203/0528; H05K 2203/107
See application file for complete search history.

(56) References Cited

U.S. PATENT DOCUMENTS

| 4,312,009 A | 1/1982 | Lange |
| 7,001,467 B2 * | 2/2006 | Pique .................... C23C 14/048 118/726 |

(Continued)

FOREIGN PATENT DOCUMENTS

| CN | 1373500 A | 10/2002 |
| CN | 101199245 A | 6/2008 |

(Continued)

OTHER PUBLICATIONS

European Patent Office, International Search Report in corresponding International Application No. PCT/NL2019/050800, dated Feb. 13, 2020 (2 pages).

*Primary Examiner* — Yaovi M Ameh
(74) *Attorney, Agent, or Firm* — Leydig, Voit & Mayer, Ltd.

(57) ABSTRACT

In a method and system for laser induced forward transfer (LIFT), energy (E1,E2) is deposited according to a non-Gaussian intensity profile (Ixy) which is spatially tuned across an interface (11xy) of the donor material (11m) to cause the donor material (11m) to be ejected from the donor substrate as an extended jet (Je) momentarily bridging the transfer distance (Zt) between the donor substrate (11) and the acceptor substrate (12) during a transfer period (Tt). A locally increased intensity spike (Is) at a center of the intensity profile (Ixy) causes a relatively thick jet (J1) of donor material to branch into a relatively thin jet (J2) at a branching position (J12) between the donor substrate (11) and acceptor substrate (12). The thick jet (J1) allows a (Continued)

relatively large transfer (Zt) distance while the thin jet (J2) deposits a relatively small droplet (Jd) of donor material (11*m*).

20 Claims, 5 Drawing Sheets

(52) U.S. Cl.
CPC ... *B41J 2202/04* (2013.01); *H05K 2203/0528* (2013.01); *H05K 2203/107* (2013.01)

(56) References Cited

U.S. PATENT DOCUMENTS

| | | |
|---|---|---|
| 2003/0017277 A1 | 1/2003 | Young et al. |
| 2009/0217517 A1 | 9/2009 | Pique et al. |
| 2017/0268100 A1 | 9/2017 | Hendriks et al. |
| 2017/0275750 A1 | 9/2017 | Munson et al. |
| 2018/0090314 A1* | 3/2018 | Kotler ............... H01L 21/683 |
| 2018/0110127 A1* | 4/2018 | Alloncle ............... H05K 3/10 |

FOREIGN PATENT DOCUMENTS

| | | | |
|---|---|---|---|
| CN | 107852818 A | 3/2018 | |
| JP | 2001107224 A | 4/2001 | |
| WO | WO-2015065182 A1 * | 5/2015 | ............ B41M 3/006 |

* cited by examiner

FIG 5B

HIGH RESOLUTION LASER INDUCED FORWARD TRANSFER

CROSS-REFERENCE TO RELATED APPLICATIONS

This patent application is a U.S. National Phase of PCT International Application No. PCT/NL2019/050800, filed Dec. 3, 2019, which claims priority to European Application No. 18210214.5, filed Dec. 4, 2018, which are both expressly incorporated by reference in their entireties, including any references contained therein.

TECHNICAL FIELD AND BACKGROUND

The present disclosure relates to laser induced forward transfer (LIFT).

Laser-induced forward transfer is an emerging printing technique, which can deposit a wide range of structural and functional materials without the use of a nozzle. In this process, a pulsed laser initiates the ejection of a small volume of ink from a thin liquid donor film, which is supported by a laser-transparent substrate, onto a parallel receiver substrate held at a distance from few tenths of microns up to few millimeters and in extreme cases lase ejected jets can even bridge donor and receiver placed at few centimeter apart. Under appropriate conditions, transfer is mediated by a high-velocity micro-jet, which achieves a high aspect ratio before detaching from the donor film.

In principle, it may be envisaged that long laser-ejected jets bridging donor and receiver substrates could enable a broad range of applications, ranging from face-up integration of thin and relatively thick components to conformal printing. However longer and thinner jets are very challenging to stabilize, requiring very strict process conditions. More specifically, a high resolution LIFT printing typically involves using thin donor layers (<15 μm) of high viscous inks/pastes that are very challenging to coat as a uniform layer. Furthermore, in a classical LIFT printing to achieve very high resolution, donor and receiver need to be brought very close to each other (maintaining a gap on only few tenths on microns), therefore making the process industrially less relevant.

There is yet a need to improve high resolution in LIFT over substantially larger transfer distances.

SUMMARY

Aspects of the present disclosure relate to methods and systems for laser induced forward transfer. Typically, a donor substrate is provided with a donor material to be transferred. An acceptor substrate is arranged at a transfer distance from the donor substrate for accepting the donor material. For example, respective substrate handlers may be arranged to hold the substrates at a desired transfer distance. The transfer of donor material can be initialized by impinging the donor substrate with a laser pulse depositing its energy into the donor material for initializing.

By depositing the energy according to a particular intensity profile the jet may be ejected from the donor substrate as an extended jet bridging a relatively larger transfer distance between the donor substrate and the acceptor substrate during a transfer period. Specifically, by providing the intensity profile with a first intensity range over a relatively large first spot size on the donor material this may facilitate the extended jet to start from the donor substrate as a corresponding relatively thick jet. Furthermore, by providing the intensity profile with a locally increased intensity spike at its center this may facilitate the thick jet to branch into a relatively thin jet at a branching position between the donor substrate and acceptor substrate by the locally increased intensity at the center. Preferably, only the thin jet reaches the acceptor substrate for depositing a droplet of its donor material before breaking up. By combining a relatively thick jet with a relatively thin jet, both the transfer distance and resolution can be improved. For example, the desired intensity profile can be achieved using two or more coinciding laser pulses of different size, preferably originating from the same beam source. Also various other parameters such as relative intensity, delay, angle, et cetera can be used to determine various aspects of the jet formation and droplet deposition.

BRIEF DESCRIPTION OF DRAWINGS

These and other features, aspects, and advantages of the apparatus, systems and methods of the present disclosure will become better understood from the following description, appended claims, and accompanying drawing wherein:

DESCRIPTION OF EMBODIMENTS

Terminology used for describing particular embodiments is not intended to be limiting of the invention. As used herein, the singular forms "a", "an" and "the" are intended to include the plural forms as well, unless the context clearly indicates otherwise. The term "and/or" includes any and all combinations of one or more of the associated listed items. It will be understood that the terms "comprises" and/or "comprising" specify the presence of stated features but do not preclude the presence or addition of one or more other features. It will be further understood that when a particular step of a method is referred to as subsequent to another step, it can directly follow said other step or one or more intermediate steps may be carried out before carrying out the particular step, unless specified otherwise. Likewise it will be understood that when a connection between structures or components is described, this connection may be established directly or through intermediate structures or components unless specified otherwise.

The invention is described more fully hereinafter with reference to the accompanying drawings, in which embodiments of the invention are shown. In the drawings, the absolute and relative sizes of systems, components, layers, and regions may be exaggerated for clarity. Embodiments may be described with reference to schematic and/or cross-section illustrations of possibly idealized embodiments and intermediate structures of the invention. In the description and drawings, like numbers refer to like elements throughout. Relative terms as well as derivatives thereof should be construed to refer to the orientation as then described or as shown in the drawing under discussion. These relative terms are for convenience of description and do not require that the system be constructed or operated in a particular orientation unless stated otherwise.

Figure 1:
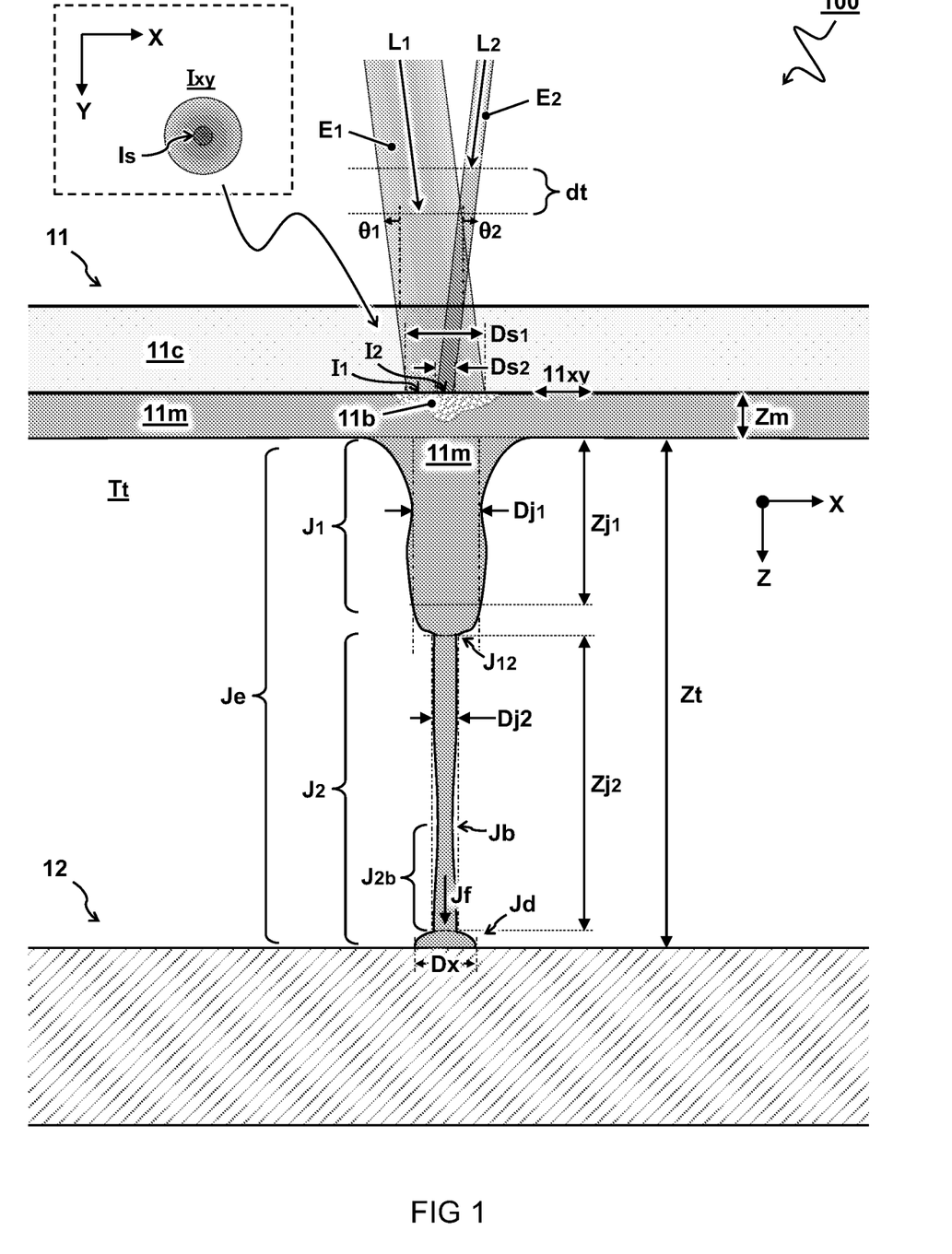
FIG. 1 illustrates LIFT with a shaped intensity profile to cause a relatively thick jet of donor material branching into a relatively thin jet.

FIG. 1 shows a schematic cross-section view of various aspects involved in laser induced forward transfer of donor material 11m between a donor substrate 11 and acceptor substrate 12.

Typically, the donor substrate 11 is provided with a donor material 11m to be transferred. In the embodiment shown, the acceptor substrate 12 is arranged at a (controlled) transfer distance "Zt" from the donor substrate 11 for accepting the donor material 11m. As described herein, the donor substrate 11 is impinged (illuminated) by one or more laser pulses "L1","L2" depositing their energy "E1","E2" into the donor material 11m for initializing the transfer.

In some embodiments, as illustrated in the dashed top-view inset, the energy "E1","E2" is deposited according to an intensity profile "Ixy" which is spatially tuned across an interface 11xy of the donor material 11m. Preferably, the intensity profile "Ixy" is configured to cause the donor material 11m to be ejected from the donor substrate as an extended jet "Je" momentarily bridging the transfer distance "Zt" between the donor substrate 11 and the acceptor substrate 12 during a transfer period "Tt". In one embodiment, the intensity profile "Ixy" has a first intensity range "I1" over a relatively large first spot size "Ds1" on the donor material 11m to cause the extended jet "Je" to start from the donor substrate 11 as a corresponding relatively thick jet "J1".

In a preferred embodiment, the intensity profile "Ixy" has a second intensity range "I2", higher than the first intensity range "I1", over a relatively small second spot size "Ds2" (smaller than the first spot size "Ds1") forming a locally increased intensity spike "Is" at a center of the intensity profile "Ixy" to cause the thick jet "J1" to branch into a relatively thin jet "J2" at a branching position "J12" between the donor substrate 11 and acceptor substrate 12 by the locally increased intensity at the center. The locally increased intensity spike "Is" in the intensity profile "Ixy" will generally be recognized as a substantial deviation on top of the normal, e.g. (single) Gaussian intensity profile. Accordingly, the total intensity profile of the combined intensity ranges and spot sizes will typically have a non-Gaussian shape. Various ways of quantifying the spike can be envisaged, e.g. as explained later with reference to FIG. 5B. Qualitatively, the spike typically has a relatively high and narrow profile compared to general trend in the rest of the (surrounding) intensity profile.

In some embodiments (not shown), the intensity profile may comprise multiple levels, e.g. a first spike which is centered on top of a second spike which is centered on the rest of the intensity profile. For example, a first spot size may be relatively large, a second spot size may be relatively small, and a third spot size even much smaller. Advantageously, a combination of three or more different spot sizes may be adapted produce an extended jet that branches two or more times into an even thinner jet and/or bridging an even larger transfer distance "Zt"

In a preferred embodiment, e.g. as shown, the spike in the intensity profile is effected by using at least two laser pulses "L1","L2" with substantially different beam width or spot size "Ds1",Ds2. By using two beams, each spot size can be easily controlled, e.g. using one or more telescopes, mirrors, lenses, et cetera, in the respective beam. Also the (relative) intensity of each spot can be easily controlled, e.g. using optical filters, beam splitters, polarizers, et cetera, in the respective beam. In some embodiments (not shown), also more than two, e.g. three, four, five, or more pulses can be used. For example, the pulses may produce a plurality of ever decreasing spot sizes centered on top of each other.

Typically, the carrier part 11c of the donor substrate 11 may be transparent or at least semi-transparent to the laser pulses. Preferably, the energy "E1","E2" of the one or more laser pulses is deposited in the donor material 11m. For example, the donor material may directly or indirectly absorb the energy "E1","E2" from the one or more laser pulses, causing the material to heat up. The heated donor material and/or solvent may form a rapidly expanding bubble 11b which initializes the transfer. Alternatively, or additionally, the energy "E1","E2" may be deposited in a sacrificial layer (not shown), e.g. between the donor material 11m and the donor carrier 11c. The sacrificial layer may similarly evaporate and/or disintegrate to initialize the transfer. Also other LIFT techniques may be used.

In one embodiment, e.g. as shown, during at least some part of the transfer period "Tt", the extended jet "Je" bridging the transfer distance "Zt" between the donor substrate 11 and acceptor substrate 12, comprises the relatively thick jet "J1" defined by a (contiguous) minimum thick jet diameter "Dj1" extending over a thick jet length "Zj1", and the relatively thin jet "J2" defined by a maximum thin jet diameter "Dj2" extending over a (contiguous) thin jet length Zj2. Preferably, the maximum thin jet diameter "Dj2" is less than the minimum thick jet diameter "Dj1" by at least a factor two, three, four, or more, e.g. up to a factor ten, or even twenty.

Preferably, only the thin jet "J2" reaches the acceptor substrate 12 for depositing a droplet "Jd" of its donor material 11m before breaking up. In principle, the smaller the maximum thin jet diameter "Dj2" compared to the minimum thick jet diameter "Dj1" the higher the possible gain in resolution and the smaller the droplet "Jd" can be. On the other hand if the thin jet becomes to narrow, it may break up too soon and/or in different parts forming debris. In some embodiments, the diameter of the thin jet is thus preferably between two and ten times smaller than that of the thick jet.

In some embodiments, the thick jet length "Zj1" is more than thirty percent of the transfer distance "Zt", preferably more than forty, fifty, or even sixty percent. Typically, the maximum transfer distance over which material can be transferred may be mostly determined by the length of the thick jet "J1". So the longer this thick jet, the higher the obtainable transfer distance. On the other hand, at least some part of the extended jet "Je" should be formed by the thin jet "J2", e.g. to obtain the desired resolution and allow the material in the thick jet "J1" to retract back to the layer of donor material 11m after jet breakup. In some embodiments, the thick jet "J1" is thus preferably less than ninety percent of the transfer distance, more preferably less than eighty percent, e.g. between fifty and seventy five percent.

In other or further embodiments, the thin jet length Zj2 is less than eighty percent of the transfer distance "Zt", preferably less than sixty percent, e.g. between twenty-five and fifty percent the transfer distance "Zt". Typically, it is observed that the extended jet "Je" will break up at a breakup point "Jb" somewhere along the thin jet "J2", e.g. near the middle of the thin jet "J2". When this happens, the donor material 11m forming a thin subsection "J2b" of the thin jet "J2" below the breakup point "Jb" may still end up in the deposited droplet "Jd". The shorter the thin jet length Zj2, the less the amount of this extra material in the thin subsection "J2b", and the smaller the droplet "Jd" can ultimately become. Also the exact position of the jet breakup "Tb" may be difficult to control. So the smaller the thin jet length Zj2, the less the uncertainty.

In a preferred embodiment, the donor material 11m on the donor substrate 11 is illuminated by at least a first laser pulse "L1" and a second laser pulse "L2" to cause, by the combined effect of the laser pulses "L1","L2", the transfer of donor material 11m towards the acceptor substrate 12. As shown, the first laser pulse "L1" has a first spot size "Ds1" impinging the donor material 11m and the second laser pulse "L2" has a second spot size "Ds2" impinging the donor material 11m. In a preferred embodiment, the second spot size "Ds2" is smaller than the first spot size "Ds1", e.g. by at least a factor two, three or five or more. Since the spot sizes may correlate with the jet thicknesses, the more different the two laser spots are in size, the more different the jet thickness. On the other hand there can be some limit to the relative thicknesses from which a stable extended jet can be formed. Accordingly, in some embodiments, the relative spot sizes may preferably be less than a factor ten different.

In some embodiments, the second laser pulse "L2" is delayed with respect to the first laser pulse "L1", e.g. by a time difference dt of at least ten or at least hundred nanoseconds. Preferably, the delay is not too large, e.g. within a time window between absorption of the first pulse and resulting (substantial) physical manifestation of the jet formation. For example, the time difference dt can be up to one microsecond, five microseconds, ten microseconds, or more. Without being bound by theory, the inventors find there may be some time between a laser pulse impinging the donor material, and the initiation of jet formation. By delaying the second laser pulse "L2", it may arrive at a time when the effect of the first laser pulse "L1" is more developed, so the second laser pulse may have more impact on the extended jet formation. Alternatively, it may also be sufficient that the pulses arrive simultaneously, or the first laser pulse "L1" may even arrive after the second laser pulse "L2".

In one embodiment, a layer thickness Zm of the donor material 11m on the donor substrate 11 is between one and five hundred micrometer, preferably between ten and two hundred micrometer, more preferably between twenty and hundred micrometer. The present methods may allow the use of a relatively thick donor layer while still providing small resolution, e.g. less than fifty micrometer. For example, the relatively wide and energetic first laser pulse "L1" may be used to initiate the transfer even in a thick donor layer, while the relatively narrow second laser pulse "L2" may determine the smaller resolution. For example, the first spot size "Ds1" is typically larger than the layer thickness Zm, e.g. by at least a factor two, three, or more. Advantageously, a relatively thick donor layer may also allow a longer extended jet to form and thus provide larger transfer distance "Zt". Also, the donor layer may be easier to apply if it does not have to be so thin.

In one embodiment, the first pulse "L1" impinges the layer of donor material 11m at a first angle $\theta 1$ with respect to a normal of the layer; wherein the second laser pulse "L2" impinges the layer of donor material 11m at a second angle $\theta 2$ with respect to a normal of the layer. Preferably, the angles $\theta 1, \theta 2$ are less than forty degrees, thirty degrees, twenty degrees, ten degrees, e.g. zero degrees (perpendicular to the layer).

The direction of the beams with respect to the donor layer may affect the direction of the resulting jet. So the lower the angle the more straight the material may be transferred. In some embodiments, the beams are parallel within an angular difference $\theta 1+\theta 2$ less than ten degrees, less than five degrees, or as parallel as possible. ⇔ Alternatively, for some applications it may be advantageous to have a relatively high angle between the beams, e.g. to deposit the material under an angle. For example, it may be envisaged that the jet forms a kink with an angle between the thick and thin jets. For these and other applications, the beams may have an angular difference $\theta 1+\theta 2$, e.g. more than ten degrees, more than twenty degrees, or even more than forty degrees.

In some embodiments, the size of one or more of the overlapping light spots is controlled during operation, e.g. as feedback based on a recorded image or movie of the extended jet "Je" and/or based on a measurement of the resulting droplet "Jd", e.g. size. For example, if it is observed that the thick jet "J1" is too thin, the first spot size "Ds1" can be increased until a desired thickness is reached. For example, if it is observed that the thin jet "J2" is too thick, the second spot size "Ds2" can be decreased until a desired thickness is reached. For example, it is observed that the resulting droplets are too large, or have a small but unpredictable size, either of the two or more spots may be adjusted.

In other or further embodiments, the (relative) intensity of each spot is controlled during operation, e.g. as feedback based on a recorded image of the extended jet "Je" and/or based on a measurement of the resulting droplet "Jd". For example, if it is observed that a thick jet length "Zj1" of the thick jet "J1" is too small and/or the thick jet "J1" is insufficiently developed, the intensity I1 of the first spot and/or the energy "E1" of the first laser pulse "L1" can be increased. For example, if it is observed that a thin jet length Zj2 of the thin jet "J2" is too small and/or the thin jet "J2" is insufficiently developed, the intensity I2 of the second spot and/or the energy E2 of the second laser pulse "L2" can be increased.

Also other parameters such as relative angle, pulse length, and/or timing of the one or more pulses may be controlled e.g. as a function of desired droplet size Dx and/or variance of this size. Also other parameters such as the transfer distance "Zt" may be varied. In one embodiment, the method or system comprises a calibration step of function where one or more of the pulse or other system parameters are varied until a (consistent) target droplet size Dx is achieved. Alternatively, or in addition to measuring the droplet size Dx, images may be recorded of the extended jet "Je" during the transfer period "Tt" and various parameters such a jet thickness and lengths may be directly measured to use as alternative or additional feedback in the calibration.

Figure 2A:
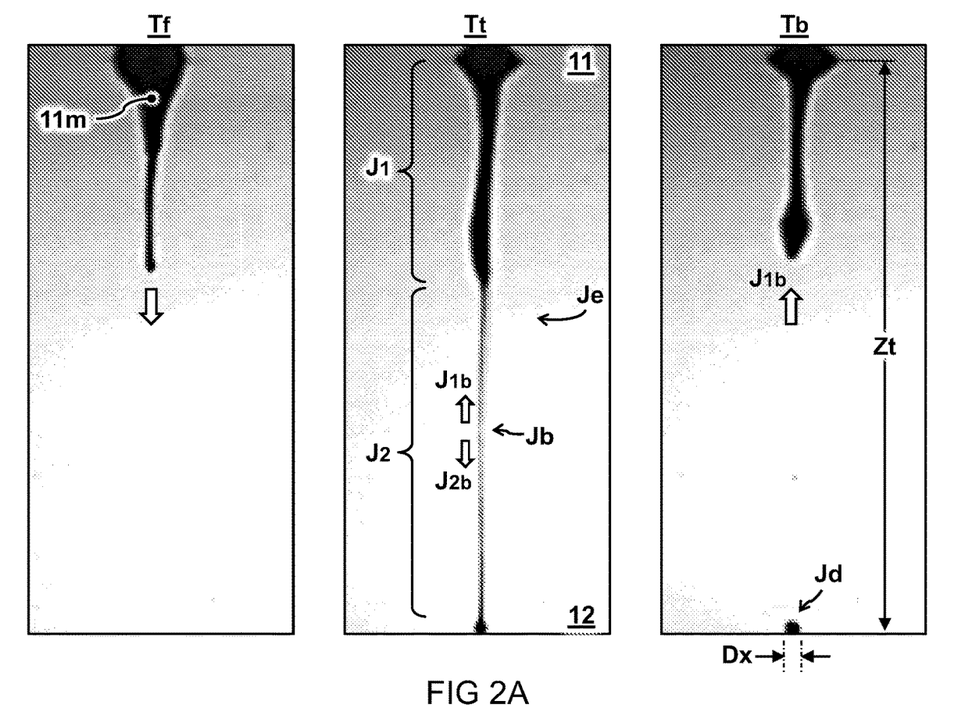
FIG. 2A illustrates recorded images of consecutive stages of jet formation, transfer period, and jet breakup, respectively.

FIG. 2A illustrates recorded images of the consecutive stages of jet formation "Tf", transfer period "Tt", and jet breakup "Tb", here using a combination of two pulses. In the images, the donor material 11m forming the jet is shown in black. The donor and acceptor substrates are disposed at the top and bottom of the images, respectively (not clearly visible here).

As shown in the left image, after energy is deposited in the donor material, jet formation "Tf" may typically initiate with a relatively thick jet which starts extending from the material layer above. As shown in the middle image, an extended jet "Je" may form starting a flow of transfer period "Tt" between the donor and acceptor substrates. During the transfer period "Tt", the extended jet "Je" may comprise a relatively thick jet "J1" branching into a relatively thin jet "J2". As shown in the right image, after some period of transfer, jet breakup "Tb" starts. If the breakup is well controlled, the majority of jet material, which is in the thick jet "J1" retracts back to the donor substrate.

As will be appreciated, various properties of the jet formation can be tuned using the present methods and systems. In particular, the formation can be tuned to accurately deposit a droplet "Jd" with relatively small size over relatively large transfer distance. For example, the intensity profiles of one or more light pulses can be spatially and/or temporally adapted to shape the jet formation process as needed.

Typically the droplet size may be determined by a combination of factors such as the diameter of the jet (in particular the thin jet "J1"), the amount of material flowing though this jet per unit of time (transfer rate), the period of time over which the flow persists (transfer period), and the position along the jet at which the breakup occurs. Preferably, the jet breakup "Tb" is configured such that most of the material in the jet retracts back to the donor substrate leaving only a small droplet "Jd" of the donor material on the acceptor substrate. The exact point of breakup may be difficult to control so there may be some variation in the droplet size.

Typically, it is observed that a breakup point "Jb" of the extended jet "Je" is somewhere along a length of the thin jet "J2". Accordingly, the absolute variation of the material droplet "Jd" can be small in view of the relatively small diameter of the thin jet, even if the exact point of breakup in the thin jet is not perfectly controlled. Further, the breakup point is likely to occur along the thin jet, typically near or around the middle between the thick jet "J1" and the acceptor substrate 12. So the division in thick and thin jets also helps to have the breakup point "Jb" closer to the acceptor substrate 12 than would be the case e.g. if the extended jet would be of a single thickness.

Typically, after reaching the acceptor substrate 12, the thin jet "J2" breaks up into a first subsection "J2b" of the thin subsection "J2b" being deposited as part of a droplet "Jd" on the acceptor substrate 12 and a second subsection staying connected via the extended jet with the donor substrate 11, and being retracted by the material properties towards the donor substrate 11.

Advantageously, the inventors find that the relative variation in droplet size may be minimized if the amount of droplet material is predominantly determined by the transfer period/rate where the material flows through the extended jet. So, in one preferred embodiment, most of the donor material in the droplet "Jd" after transfer originates from a flow Jf of the donor material 11m during a material transfer period "Tt" while the jet "Je" extends unbroken between the donor and acceptor substrates 11,12. Additionally, or alternatively, it is found preferable that relatively little of the droplet material comes from a part "J2b" of the jet falling towards the acceptor substrate 12 after jet breakup "Tb". For example, the percentage of material in the droplet originating from the material transfer period "Tt" is more than fifty percent, seventy percent, eighty percent, ninety percent, or more. The higher the fraction of material determined by the material flow, the less effect a not fully controlled breakup point "Jb" may have on the total droplet size. Accordingly the droplet size can be more consistently controlled.

In some embodiments, enabled by the present teachings, the transfer distance "Zt" between the donor substrate 11 and acceptor substrate 12 is more than a size Dx (e.g. cross-section diameter) of the deposited droplet "Jd" by at least a factor four, preferably at least a factor ten, or even more than a factor twenty. For example, the size of the droplet "Jd" is less than fifty micrometer and the transfer distance "Zt" is more than two hundred micrometer. It will be appreciated that the present methods and systems may allow relatively large transfer distance while still providing relatively good resolution. For example, to achieve dots less than fifty micrometer with a single beam the typical maximum transfer distance is found to be less than hundred fifty micrometer. Typically, it may be difficult to maintain such small distance. With the present methods using a dual spot the inventors find the transfer distance for printing forty micrometer dots can be increased even up to five hundred micrometer, or more. Keeping the distance between substrates around half a millimeter may be relatively easy.

Figure 2B:
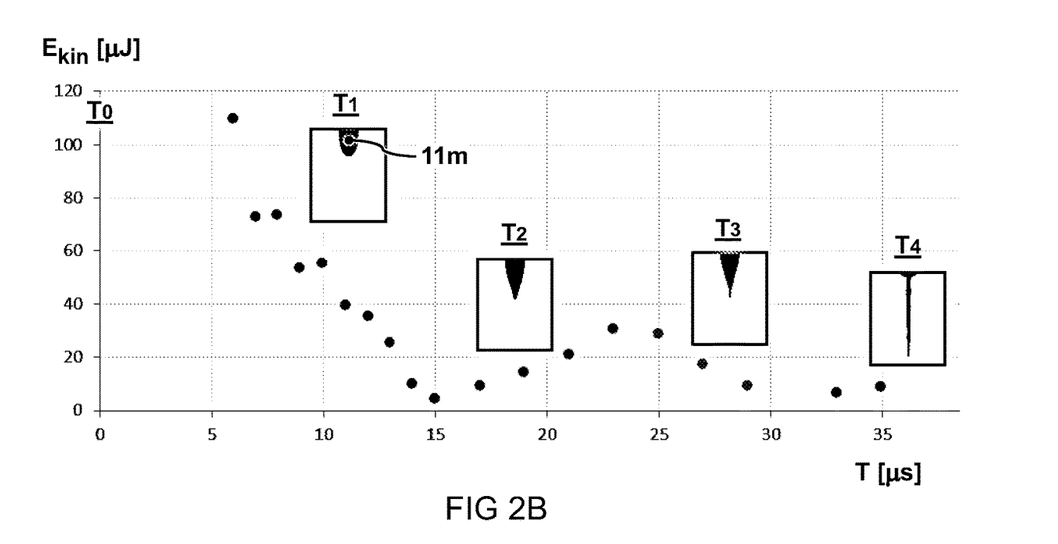
FIG. 2B illustrates typical stages of a LIFT process related to the kinetic energy of the donor material as a function of time.

FIG. 2B illustrates typical stages of a LIFT process related to the kinetic energy "Ekin" of the donor material 11m as a function of time "T".

Without being bound by theory, the following description is provided to facilitate understanding of various observations. The process starts at time "T0" with the absorption of the pulse energy (energies) in the donor material. This may lead to the formation of a growing bubble 11b, e.g. as illustrated in FIG. 1. For example, the bubble may be formed by evaporated and/or disintegrated donor material, solvent, or e.g. sacrificial layer. Around the time "T1", e.g. as a result of the expanding bubble, a jet of the donor material 11m may be propelled forward with kinetic energy "Ekin" from the rest of the donor layer. For example, there can be a few (here more than ten) microseconds between the impact of the laser pulse and the formation of the jet. It may be noted that the kinetic energy "Ekin" of the material is initially higher and may start to decrease at time, e.g. as the viscosity or cohesion of the material may partially dissipate the energy. Around time "T2" some of the material may starts to pick up kinetic energy. Around time "T3", some of the material may again be pulled back to the donor layer, e.g. due to fluid cohesion, while another fraction continues to leak down. Finally, around time "T4", an extended jet of material may be formed reaching the acceptor substrate. Donor material may flow through the extended jet between the donor substrate 11 and acceptor substrate 12 until the jet breaks up some time later (not indicated here).

In a preferred embodiment, the donor material 11m is a liquid, e.g. paste or ink. More preferably, the donor material 11m has relatively high viscosity. For example, the (dynamic) viscosity is preferably at least one Pascal second (Pa·s), more preferably at least two Pascal second, most preferably at least three Pascal second (=3000 centipoise, cP), or more. For example, the viscosity can be up to ten, twenty, hundred Pascal second, or more. By providing donor material with a particular viscosity the jet formation process may be suitably controlled to mold the jet in a desired shape. For example, the viscosity is measured at room temperature (20° C. or 293 Kelvin). For example, the viscosity is measured at a relatively low shearing rate such as such as one per second (1 s$^{-1}$), or less. Most preferably, the donor material 11m is a shear thinning liquid, i.e. the viscosity decreases with the rate of shear strain. Accordingly, the material may becomes relatively 'flowy' (less viscous) when high shear is applied e.g. through bubble expansion. This can be advantageous for processes such as funneling and material feeding used herein.

In some embodiments, the donor material 11m comprises a conductive material. Also semi-conductive or non-conductive/isolation (dielectric) material can be used. For example, the present methods and systems may be applied to form an electronic circuit. For example, relatively thin circuit lines or other electrical components/structures can be drawn (printed) on the acceptor substrate 12 by applying an interconnected pattern of multiple droplets "Jd". In one embodiment, the conductive material comprises a solder. In some embodiments, donor material 11*m* (at least when it is still applied to the donor substrate 11) comprises other components or materials to facilitate the transfer. In one embodiment, the donor material 11*m* comprises a shear thinning material, e.g. a solder paste with shear thinning flux or conductive adhesive.

In principle the donor material 11*m* may comprise any material that is liquid, or can be brought to liquid state under the influence of the one or more laser pulses. For example, it may also be envisaged to apply the present methods to pure metals, optionally using a delay between the pulses. For example, a first pulse causes ablation and/or thrust, and a subsequent pulse may arrive to further propel and/or shape the molten extra jet.

Figure 3A:
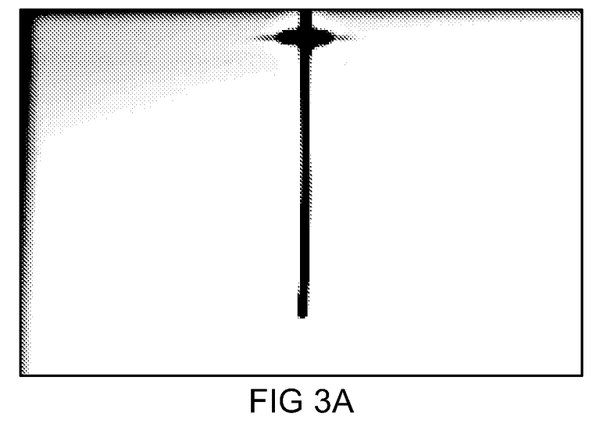
FIGS. 3A-3C illustrates a comparison of jet formation resulting from a single pulse with large spot size, a single pulse with small spot size, and a combination of two pulses having large and small spot sizes.
Figure 3B:
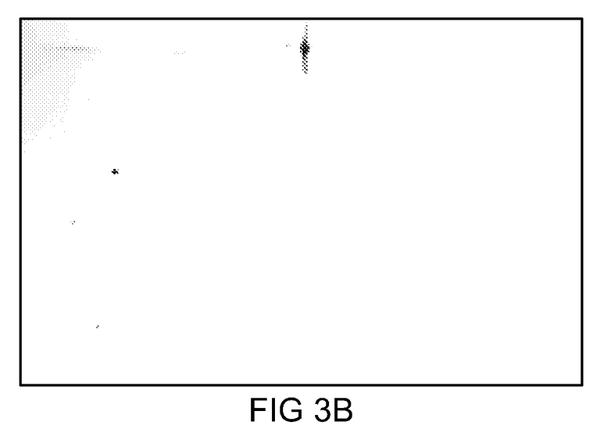
Figure 3C:
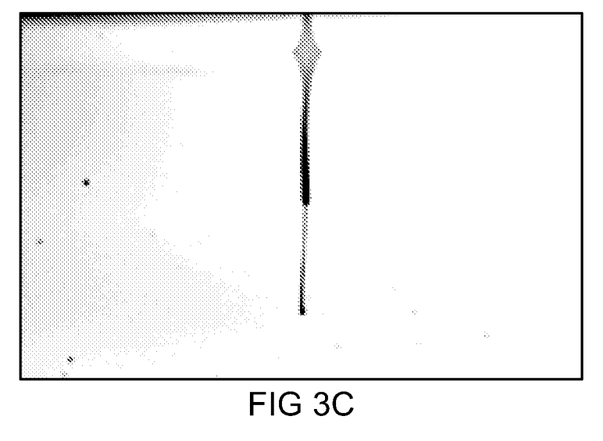

FIGS. 3A-3C illustrates a comparison of jet formation resulting from a single pulse with large spot size, a single pulse with small spot size, and a combination of two pulses having large and small spot sizes. As shown in FIG. 3A, a single pulse having relatively wide spot size may produce a relatively wide jet bridging a significant transfer distance. However, it may be difficult to write high resolution features with such a thick jet. As shown in FIG. 3B, a single pulse having relatively narrow spot size may produce a relatively thin jet bridging which in principle may produce a small droplet. However, the transfer distance of the thin jet is relatively small which may be difficult to control. As shown in FIG. 3C, a combination of a two coinciding pulses and/or spiked intensity profile may produce a thick jet branching into a thin jet. As will be appreciated, the present teachings may thus provide synergetic advantages including relatively small droplet deposition over relatively large transfer distances.

Figure 4A:
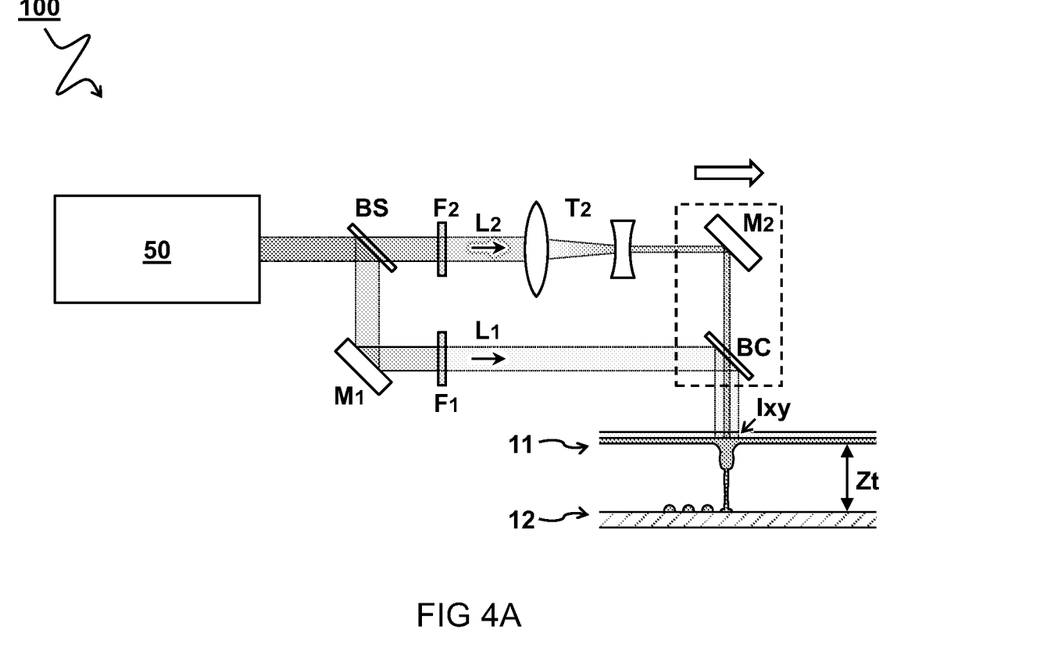
FIGS. 4A and 4B illustrates systems for laser induced forward transfer.
Figure 4B:
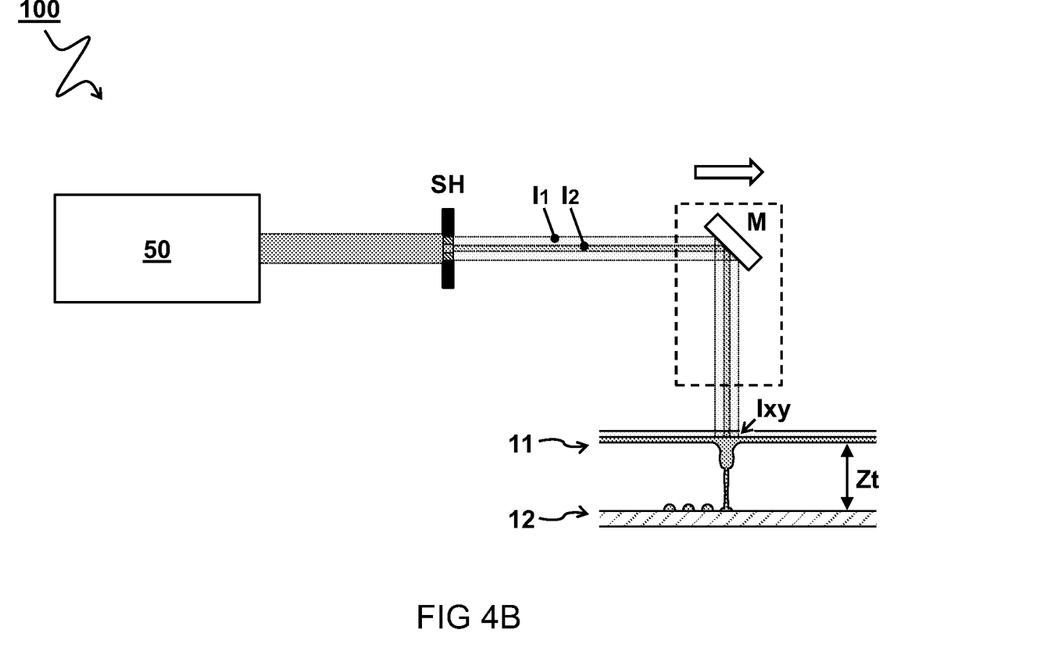

FIGS. 4A and 4B illustrates a system 100 for laser induced forward transfer LIFT of donor material 11*m* from a donor substrate 11 to an acceptor substrate 12 over a transfer distance "Zt".

In one embodiment, substrate handlers (not shown) such as platforms and/or rollers, are configured to arrange the donor substrate 11 and acceptor substrate 12 at respective positions separated by the transfer distance "Zt". For example, one or more of the donor substrate 11 and/or acceptor substrate 12 may be foil based. Typically, at least one light source 50 is configured to impinge the donor substrate 11 with one or more laser pulses "L1","L2" depositing their energy into the donor material 11*m* for initializing the transfer. Preferably, the system is configured to deposit the energy according to an intensity profile "Ixy" which is spatially tuned as described herein.

In a preferred embodiment, e.g. as shown in FIG. 4A, an intensity spike in the intensity profile "Ixy" is caused by a impacting the donor material 11*m* with at least two laser pulses "L1","L2". Most preferably, the at least two laser pulses "L1","L2" originate from a single laser pulse. For example, the original laser pulse is split along a first light path and a second light path meeting again with overlapping laser spots on the donor material 11*m*. Also more pulses can be split off into three, four, or more different light paths. Alternatively, two or more separate lasers can be used (not shown) to generate overlapping pulses on the donor substrate 11.

In some embodiments, one pulse can be delayed with respect to another pulse using a delay stage (not shown) in at least one of the light paths. This can be particularly advantageous if the pulses originate from one light source, e.g. laser 50. Alternatively, or in addition, the pulses may originate from different sources (not shown) where the pulse generation of one pulse is delayed with respect to the other pulse. This may more easily allow relatively large pulse delays.

In some embodiments, the system comprises one or more beam splitters "BS" to split a light pulse from one light source 50 in at least a first laser pulse "L1" traveling along a first light path, and a second laser pulse "L2" traveling along a second light path. In another or further embodiment, the system comprises an optical component T2 to decrease a beam diameter of the second laser pulse "L2" with respect to a beam diameter of the first laser pulse "L1" and/or increase the beam diameter of the first laser pulse "L1" with respect to the second laser pulse "L2".

Preferably, the system is configured to overlap the beam paths as coinciding spots of different sized onto the donor substrate 11. For example, a beam combiner "BC" can be used to overlap both beam position and beam direction. For example, a combination of a polarizing beam splitter and beam combiner can be used. Alternatively, or additionally, semi-transparent mirrors can be use. Alternatively, or in addition to a beam combiner, beams can simply be projected with overlapping spots on the donor substrate, e.g. with different angles or almost parallel beams. Alternatively, or in addition to splitting beam paths, in some embodiments, the system comprises a beam shaper "SH" to help achieve the desired intensity profile "Ixy". For example, as shown in FIG. 4B, the beam shaper may allow for a relatively simple beam path. On the other hand, the use of two or more separate pulses may allow more versatility in shaping the individual aspects of the overlapping laser spots and also allow further optimizations such as the relative timing and angle.

In some embodiments, the one, preferably two or more laser pulses are nanosecond pulses which can be relatively easy to produce and may provide desired transfer characteristic. Alternatively, also other pulse lengths may be used. In one embodiment, a single picosecond pulse is used. For example, non-linear absorption of the picosecond pulse may at least partially contribute to the spiked intensity at the center of the intensity profile "Ixy" without the need for a second pulse. However, the process may be more difficult to control.

Also other or further processes may play a role. For example, when using a single pulse with high enough energy, the pulse may cause damage to the donor carrier 11*c*, e.g. glass plate. In one embodiment, a single pulse is used with an energy and/or intensity tuned such that it not only heats the donor material 11*m* but also causes some damage to an interface of the donor carrier 11*c* between the donor carrier 11*c* and donor material 11*m*, e.g. creating plasma or ablation of the donor carrier 11*c* at the interface, preferably concentrated as a spike at the center of the beam spot. The inventors find that such process may provides an additional 'kick' to initiate formation of the secondary (thinner) jet, similar to other mechanisms described herein. For example, this may be used in combination with a disposable carrier. Preferably, the energy and/or intensity of the pulse is however small enough that the damage does not extend into the bulk carrier material, e.g. the damage not extending beyond 10% of the carrier thickness into the carrier. Otherwise the damage may e.g. hinder transmission of the light.

In some embodiments, e.g. as shown, the laser beam is moved over a stationary surface of the donor substrate 11 to produce a pattern of droplets on the acceptor substrate 12. This may allow the laser to perform a rapid succession of droplet depositions, e.g. wherein the jet formation is minimally affected by movement of the substrates. Alternatively, or additionally, the donor substrate 11 and/or acceptor substrate 12 can be moved with respect to a stationary laser spot, e.g. in between depositions.

While the figures show a single beam impacting the substrate, the deposition could also be performed with multiple beams. For example, two or more beams could write patterns in parallel at different locations. In one embodiment, a mask is disposed between a (wide beam) light source to write a whole pattern of droplets simultaneously. For example, the mask comprises a pixelated pattern, wherein each pixel acts as a beam shaper produces an intensity profile "Ixy", as described herein. The pattern can also be produced using multiple masks. For example, a first mask has a pattern of relatively large holes to produce the first spot sizes, and a second mask has the same pattern but with relatively small holes to produce the second spot sized. The two patterns can be overlapped on the donor substrate. It can also be envisaged to place the masks in series, e.g. wherein the masking material of at least the smaller hole mask is semi transparent, so part of the masked light will pass through to the other mask or donor substrate. In some embodiments, one or more beam shapers can act as mask, each producing multiple parallel intensity profiles, as described herein. Alternatively, or in addition to a laser, also other light sources such as a flash lamp can be used. This is particularly useful to illuminate a large mask pattern.

Figure 5A:
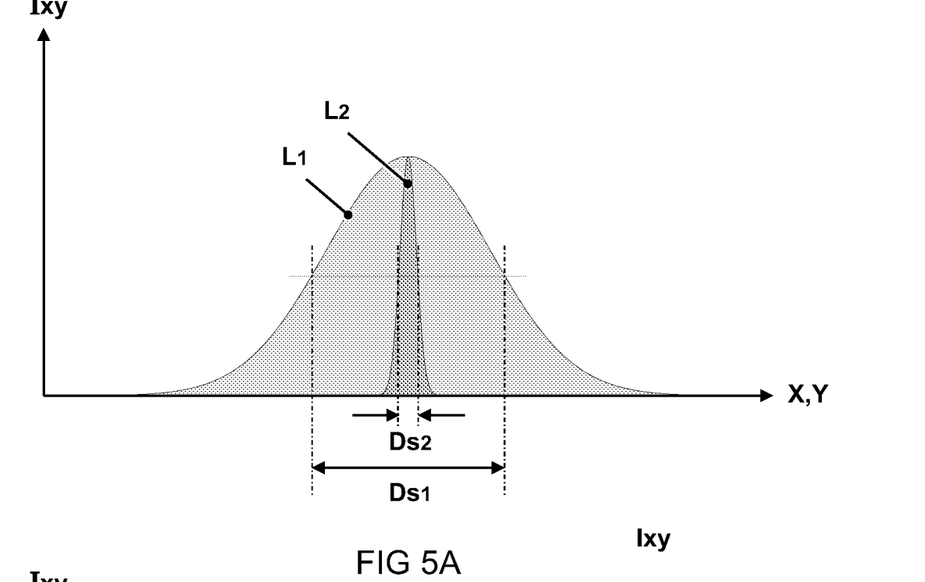
FIG. 5A illustrates individual overlapped intensity profiles of a first laser pulse with relatively large spot size, and a second laser pulse with relatively small spot size.

FIG. 5A illustrates separate intensity profiles of a first laser pulse "L1" with relatively large spot size "Ds1", and a second laser pulse "L2" with relatively small spot size "Ds2";

Preferably, as described herein, the second spot size "Ds2" is relatively small. For example, the second spot size "Ds2" is less than hundred micrometer, less than fifty micrometers, or less than thirty micrometers, e.g. between five and twenty micrometers, or less. It will be appreciated that the relatively small second spot size "Ds2" may correlate with a relatively small maximum thin jet diameter "Dj2", so better resolution. Preferably, the first spot size "Ds1" is relatively large. For example, the first laser pulse "L1" has a spot size between thirty and three hundred micrometers, or more. As described herein, the spot size may be the determined e.g. as the full width half maximum (FWHM) of the spot intensity on the donor material lim.

Preferably, the laser spots of the first laser pulse "L1" and the second laser pulse "L2" coincide on the donor material, e.g. the centers of the spots coincide within a distance of fifty, thirty, twenty, or ten percent of the largest spot size. Most preferably, the intensity profile "Ixy" is rotation symmetric. Accordingly, the intensity profile may have similar shape in the X and Y directions along the donor substrate interface. Also, the laser spots may have substantially circular coinciding profiles.

In one embodiment, the first laser pulse "L1" has a higher pulse energy than the second laser pulse "L2", e.g. by at least a factor two, three, or four, e.g. between two and ten, or more. The relatively high energy of the first laser pulse "L1" may help to initiate the material transfer over a large donor area. Because the energy of the first laser pulse "L1" is spread over a relatively large illumination area, the maximum intensity of the first laser pulse "L1" can still be similar, or even lower than that of the second laser pulse "L2". Also a higher intensity second laser pulse may be used, if desired.

Figure 5B:
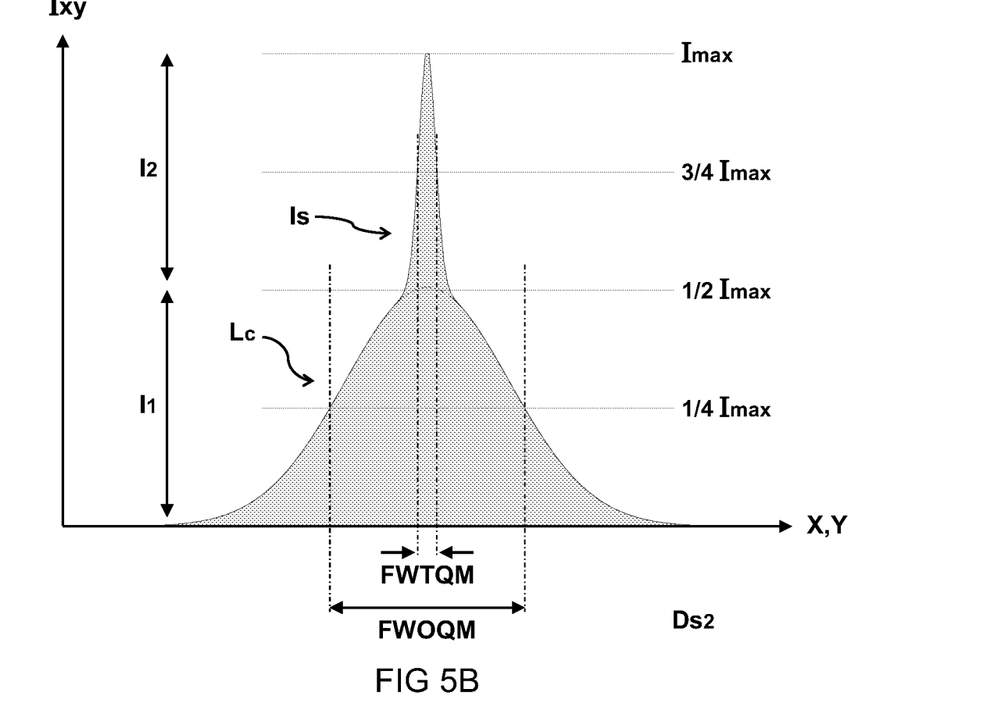
FIG. 5B illustrates the combined (added) intensity profile with a spike, e.g. resulting from two overlapping laser pulses with different sizes.

FIG. 5B illustrates a combined (added) intensity profile "Ixy". For example, this may correspond to the two overlapping laser pulses of FIG. 5A. Alternatively to overlapping two simultaneous pulses, at least some of the desired effect may be achieved with a single pulse which is shaped to effectively provide the same intensity profile on the donor layer as the two pulses described herein. For example, the single pulse can be shaped to have an intensity profile with a locally higher intensity in a small subsection of the total spot size.

In some embodiments, the locally higher intensity spike may be quantified by comparing the full width of the intensity profile "Ixy" at different heights. For example, the full width at three quarters maximum ("FWTQM") is compared to the full width at one quarter of the maximum ("FWOQM"). As may be noted when comparing FIGS. 4A and 4B, when using two pulses of similar maximum intensity but different spot size or beam width, the FWOQM may roughly correspond to the FWHM of the wider first pulse "L1", i.e. Ds1, while the FWTQM may roughly correspond to the FWHM of the narrower second pulse "L2", i.e. Ds2. So the considerations of relative spot sizes when using two pulses may be translated to similar relative values of the FWTQM and the FWOQM. In particular, it is be preferred that the FWTQM is much smaller than the FWOQM, e.g. by at least a factor four, five, six, seven, ten, twenty, or more.

Without being bound by theory, this may be compared to a Gaussian profile which can be written as $I(x)=I_{max}\cdot\exp(-x^2/2\sigma^2)$, where $I_{max}$ is the maximum intensity, x is the distance from the maximum, and σ is the variance or standard deviation. So it can be derived that a Gaussian has FWTQM=$\sigma\cdot 2\sqrt{2\ln(4/3)}$ which is about 1.51 times the variance σ, and FWOQM=$\sigma\cdot 2\sqrt{2\ln(4)}$ which is about 3.33 times the variance σ. So for a single Gaussian the FWTQM is smaller than the FWOQM by only a factor 2.19 (compared to the above mentioned factor four, or more)

Of course also other ways of quantifying the spike can be envisaged. For example, the total energy in the intensity profile "Ixy" may be compared to a percentage of that energy within a central subsection. For example, in a typical Gaussian profile, about sixty-eight percent of the energy is contained within one standard deviation (one sigma) from the center, while the addition of the central spike may increase this percentage to more than seventy percent, more than seventy-five percent, more than eighty percent, or even more than ninety percent. The more pronounced the central spike, the more percent of total energy will be located there.

In interpreting the appended claims, it should be understood that the word "comprising" does not exclude the presence of other elements or acts than those listed in a given claim; the word "a" or "an" preceding an element does not exclude the presence of a plurality of such elements; any reference signs in the claims do not limit their scope; several "means" may be represented by the same or different item(s) or implemented structure or function; any of the disclosed devices or portions thereof may be combined together or separated into further portions unless specifically stated otherwise. Where one claim refers to another claim, this may indicate synergetic advantage achieved by the combination of their respective features. But the mere fact that certain measures are recited in mutually different claims does not indicate that a combination of these measures cannot also be used to advantage. The present embodiments may thus include all working combinations of the claims wherein each claim can in principle refer to any preceding claim unless clearly excluded by context.

The invention claimed is:

1. A method for laser induced forward transfer, the method comprising:
providing a donor substrate with a donor material layer comprising a donor material to be transferred;
providing an acceptor substrate, at a transfer distance from the donor substrate, for accepting the donor material;
impinging the donor substrate with one or more laser pulses that deposit energy into the donor material layer for initializing transfer of the donor material from the donor material layer to the acceptor substrate;
wherein, during the impinging, the energy is deposited according to an intensity profile that is spatially tuned across an interface of the donor material layer to cause donor material to be ejected away from the donor substrate as an extended jet that momentarily bridges the transfer distance between the donor substrate and the acceptor substrate during a transfer period;
wherein the intensity profile has a first intensity range over a relatively large first spot size on the donor material to cause the extended jet to start from the donor substrate as a relatively thick jet;
wherein the intensity profile has a second intensity range, higher than the first intensity range, over a relatively small second spot size, smaller than the first spot size,
wherein the intensity profile of the combined intensity ranges and spot sizes have a non-Gaussian shape with a locally increased intensity spike at a center of the intensity profile to cause the thick jet to branch into a relatively thin jet at a branching position between the donor substrate and acceptor substrate by the locally increased intensity at the center, and
wherein only the thin jet reaches the acceptor substrate for depositing a droplet of donor material before breaking up the extended jet.

2. The method of claim 1, wherein the donor substrate is impinged by at least two laser pulses,
wherein the first laser pulse has a first light path that is at least partially different from a second light path of the second laser pulse, and
wherein the first and second light paths are recombined at the donor substrate to cause, by the combined effect of the laser pulses, the transfer of donor material towards the acceptor substrate.

3. The method of claim 2, wherein the first laser pulse has a first light spot having a first spot size impinging the donor material and the second laser pulse has a second light spot having a second spot size impinging the donor material, and
wherein a second distance across the second spot size is smaller than a first distance across the first spot size by at least a factor two.

4. The method of claim 2, wherein a timing of the second laser pulse initially reaching the donor substrate is delayed with respect to the first laser pulse initially reaching the donor substrate, by a time difference between ten nanoseconds and ten microseconds.

5. The method of claim 2, wherein the first laser pulse has a first pulse energy that is higher than a second pulse energy of the second laser pulse by at least a factor two.

6. The method of claim 3, wherein a size and/or intensity of one or more of the first and second light spots is controlled during operation based on recorded images of the extended jet and/or based on a measurement of the resulting droplet size.

7. The method of claim 1, wherein a magnitude of the transfer distance between the donor substrate and acceptor substrate is more than a size of the deposited droplet by at least a factor ten.

8. The method of claim 1, wherein a layer thickness of the donor material layer on the donor substrate is between twenty and a hundred micrometers.

9. The method of claim 1, wherein, during at least some part of the transfer period, the extended jet bridging the transfer distance between the donor substrate and acceptor substrate, comprises:
the relatively thick jet defined by a minimum thick jet diameter extending over a thick jet length, and
the relatively thin jet defined by a maximum thin jet diameter extending over a thin jet length;
wherein the maximum thin jet diameter is less than the minimum thick jet diameter by at least a factor two;
wherein the thick jet length is more than fifty percent of a magnitude of the transfer distance;
wherein the thin jet length is between twenty-five and fifty percent of the magnitude of the transfer distance.

10. The method of claim 1, wherein, after reaching the acceptor substrate, the thin jet breaks up-into a first subsection of the thin subsection being deposited as part of a droplet on the acceptor substrate and a second subsection staying connected via the extended jet with the donor substrate, and being retracted, in accordance with material properties, towards the donor substrate.

11. The method of claim 1, wherein most of the donor material in the droplet, after transfer, originates from a flow of the donor material during a material transfer period while the jet extends unbroken between the donor and acceptor substrates.

12. The method of claim 1, wherein the donor material comprises a shear thinning liquid.

13. The method of claim 1, wherein the donor material comprises a conductive material, and
wherein the method comprises printing an electronic circuit on the acceptor substrate by deposition of multiple ones of donor material droplets on the acceptor substrate.

14. A system for laser induced forward transfer of donor material from donor material layer, on a donor substrate, to an acceptor substrate over a transfer distance, the system comprising
substrate handlers configured to arrange the donor substrate and the acceptor substrate at respective positions separated by the transfer distance; and
at least one light source configured to impinge the donor substrate with one or more laser pulses depositing their energy into the donor material for initializing transfer of the donor material from the donor material layer to the acceptor substrate;
wherein the system is configured to deposit the energy according to an intensity profile that is spatially tuned across an interface of the donor material layer to cause donor material to be ejected away from the donor substrate as an extended jet that momentarily bridges the transfer distance between the donor substrate and the acceptor substrate;
wherein the intensity profile has a first intensity range over a relatively large first spot size on the donor material to cause the extended jet to start from the donor substrate as a relatively thick jet;

wherein the intensity profile has a second intensity range, higher than the first intensity range, over a relatively small second spot size, smaller than the first spot size, wherein the intensity profile of the combined intensity ranges and spot sizes has a non-Gaussian shape with a locally increased intensity spike at a center of the intensity profile to cause the thick jet to branch into a relatively thin jet at a branching position between the donor substrate and acceptor substrate by the locally increased intensity at the center, and wherein only the thin jet reaches the acceptor substrate for depositing a droplet of donor material before breaking up the extended jet.

15. The system of claim 14, further comprising a beam splitter to split a light pulse from one light source in a first laser pulse traveling along a first light path, and a second laser pulse traveling along a second light path, and wherein the system further comprises an optical component to:

decrease a beam diameter of the second laser pulse with respect to a beam diameter of the first laser pulse, and/or increase the beam diameter of the first laser pulse with respect to the beam diameter the second laser pulse, wherein the system is configured to overlap the beam first beam path and the second beam path as coinciding spots of different sizes onto the donor substrate.

16. The system of claim 15, further comprising a delay stage to delay the second laser pulse initially reaching the donor substrate with respect to the first laser pulse initially reaching the donor substrate, by a time difference between ten nanoseconds and ten microseconds.

17. The system of claim 15, further configured to provide the first laser pulse at a first pulse energy that is higher than a second pulse energy of the second laser pulse by at least a factor two.

18. The system of claim 14, further configured to control a size and/or intensity of one or more of the first and second light spots during operation based on recorded images of the extended jet and/or based on a measurement of the resulting droplet size.

19. The system of claim 14, wherein the donor material layer comprises donor material formed by a layer of shear thinning conductive material having a layer thickness between twenty and a hundred micrometers.

20. The system of claim 14, wherein a magnitude of the transfer distance between the donor substrate and acceptor substrate is more than two hundred micrometers.

* * * * *